(12) United States Patent
Eo et al.

(10) Patent No.: US 6,972,628 B2
(45) Date of Patent: Dec. 6, 2005

(54) INTEGRATABLE, VOLTAGE-CONTROLLED RF POWER AMPLIFIER

(75) Inventors: Yun-Seong Eo, Suwon-si (KR); Gea-Ok Cho, Yongin-si (KR); Kwang-Du Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 73 days.

(21) Appl. No.: 10/772,553

(22) Filed: Feb. 5, 2004

(65) Prior Publication Data

US 2004/0232989 A1    Nov. 25, 2004

(30) Foreign Application Priority Data

May 19, 2003   (KR)   ................. 10-2003-0031726

(51) Int. Cl.[7] ............................................. H03G 3/10
(52) U.S. Cl. .................... 330/285; 330/133; 330/136
(58) Field of Search ............................... 330/129, 133, 330/136, 285, 296

(56) References Cited

U.S. PATENT DOCUMENTS

| | | | | |
|---|---|---|---|---|
| 3,900,823 A | * | 8/1975 | Sokal et al. ................. | 330/149 |
| 4,377,788 A | * | 3/1983 | Christopher et al. ......... | 330/136 |
| 4,465,981 A | * | 8/1984 | Pike ........................... | 330/281 |
| 5,329,244 A | * | 7/1994 | Fujita et al. ................. | 330/149 |
| 5,363,058 A | * | 11/1994 | Sasaki ........................ | 330/136 |
| 6,304,145 B1 | * | 10/2001 | Laureanti et al. ........... | 330/285 |
| 6,650,181 B2 | * | 11/2003 | Shinjo et al. ................ | 330/136 |
| 6,710,649 B2 | * | 3/2004 | Matsumoto et al. ..... | 330/124 R |
| 6,822,517 B2 | * | 11/2004 | Matsumoto et al. ........ | 330/295 |
| 2003/0102924 A1 | | 6/2003 | Matsumoto et al. | |

FOREIGN PATENT DOCUMENTS

| | | |
|---|---|---|
| EP | 0 561 346 | 3/1993 |
| EP | 0 854 569 | 7/1998 |

* cited by examiner

Primary Examiner—Peguy JeanPierre
Assistant Examiner—Khai M. Nguyen
(74) Attorney, Agent, or Firm—Dilworth & Barrese LLP (57) ABSTRACT

Disclosed herein is an integratable power amplifier having a variable bias voltage, in which a first bias controller detects the amplitude of an RF signal and outputs a DC signal varying with the detected amplitude based on the non-linearity of a rectification transistor. A second bias controller generates a bias voltage that optimizes amplification efficiency by adjusting the voltage of the DC signal received from the first bias controller through a source follower transistor being a complementary device. An amplifier transistor is activated by a driving voltage, amplifies the input signal according to the bias voltage received from the second bias controller, and outputs the amplified signal.

20 Claims, 7 Drawing Sheets

INTEGRATABLE, VOLTAGE-CONTROLLED RF POWER AMPLIFIER

PRIORITY

This application claims priority under 35 U.S.C. §119 to an application entitled "Integratable, Voltage-Controlled RF Power Controller" filed in the Korean Intellectual Property Office on May 19, 2003 and assigned Serial No. 2003-31726, the contents of which are incorporated herein by reference.

BACKGROUND OF THE INVENTION

1. Field of the Invention

The present invention relates generally to a power amplifier, and in particular, to an integratable power amplifier having a variable bias voltage.

2. Description of the Related Art

In general, a power amplifier amplifies an RF (Radio Frequency) signal at the output of a transmitter prior to transmission in a small-size communication device. In view of the use of the power amplifier at the output, concerns regarding the linearity of the amplified signal range are very significant. Amplification efficiency is also a consideration because a large amount of current is required to amplify the RF signal to a high power level. In fact, a power amplifier consumes about 50% of the power of an RF circuit, for example, in a cellular phone. Thus, the efficiency of the power amplifier is a dominant factor determining the life of a battery.

Since the amplitude of an RF output signal of the power amplifier varies greatly with communication distance, efficiency improvement can be considered in two ways: efficiency improvement at a maximum output signal and efficiency improvement at a low output signal. Considering that small-size communication devices are usually used at low power, improvement in the efficiency of the power amplifier for a low-power RF signal has a direct, great influence on the use time and life of the terminal battery. In this context, various techniques are being developed to improve amplification efficiency at low power, maintaining performance at a peak power in a power amplifier and thus to improve performance of a small-size communication device.

Figure 1:
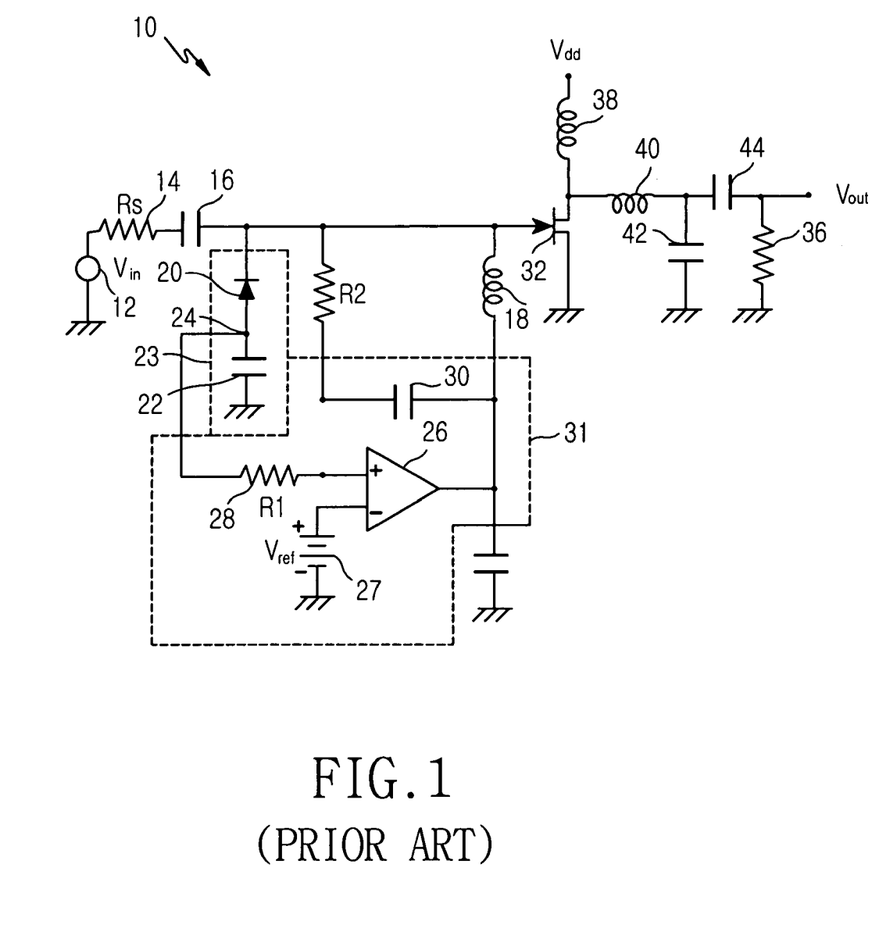
FIG. 1 is a circuit diagram of a conventional power amplifier in which an RF power level is detected at its input end.
Figure 2:
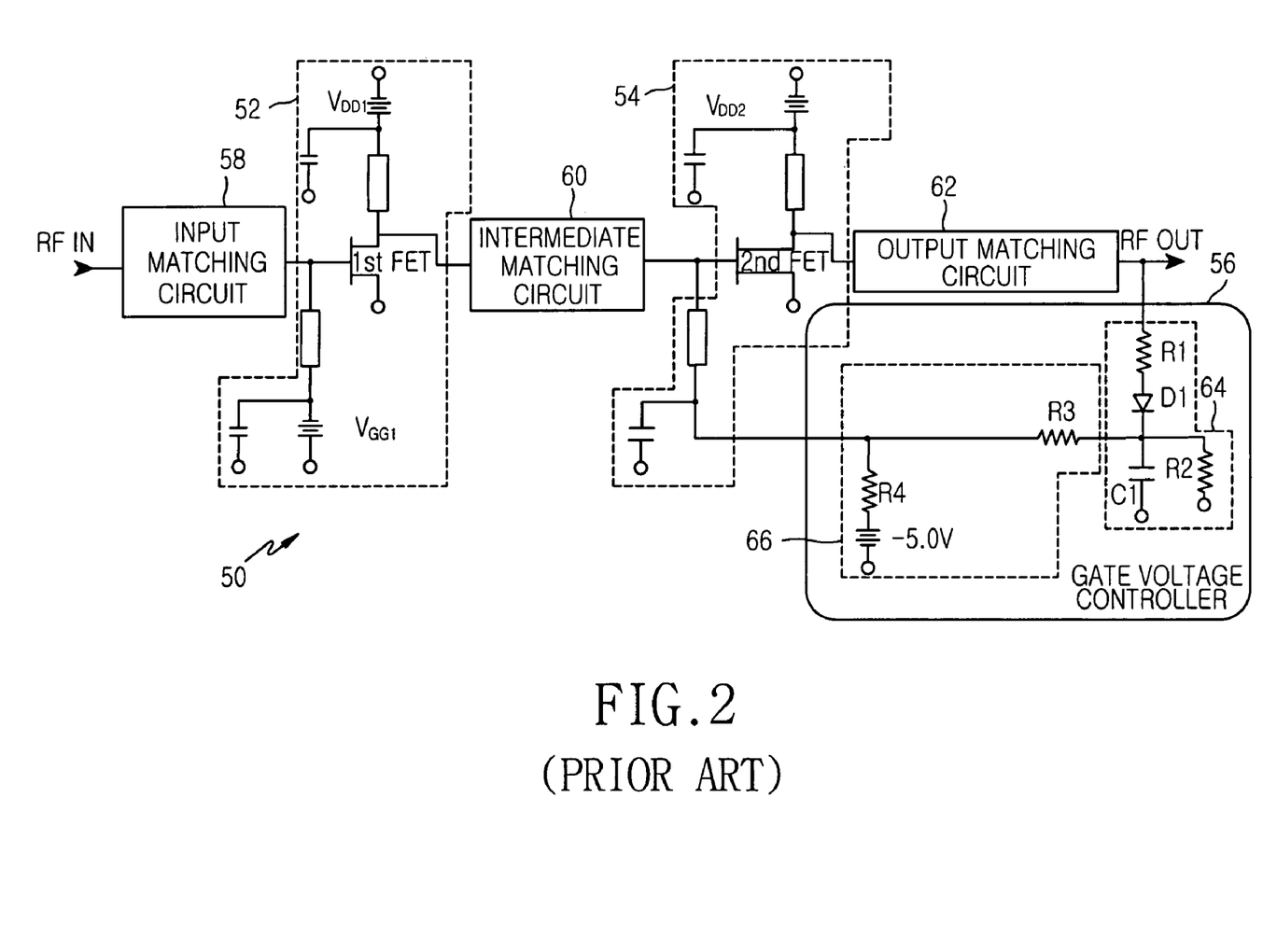
FIG. 2 is a circuit diagram of another conventional power amplifier in which an RF power level is detected at its output end.

Conventional power amplifier circuits with low-power efficiency improved through bias control are illustrated in FIGS. 1 and 2.

FIG. 1 is a circuit diagram of a conventional power amplifier in which the bias voltage of an amplifier transistor varies with a detected RF power level at an input end.

Referring to FIG. 1, an input source 12 having a source impedance Rs implemented as a resistor 14 applies an input signal $V_{in}$ to an RF power amplifier 10. The input source 12 is connected to a DC (Direct Current) blocking capacitor 16. The DC blocking capacitor 16 forms an input impedance matching network for an amplifier transistor 32 in conjunction with an inductor 18. A diode 20 has a cathode connected to one end of the capacitor 16 and an anode connected to one end of a holding capacitor 22.

The other end of the holding capacitor 22 is grounded. The diode 20 and the holding capacitor 22 collectively form a negative peak detector 23. Most negative voltage at the cathode of the diode 20 is held between the holding capacitor 22 and the diode 20 by the holding capacitor 22. A voltage at a node 24 is fed to a low-pass feedback amplifier 31 including a control amplifier 26, a voltage source 27, a resistor 28, and a capacitor 30.

A drain current of the transistor 32 is converted to an output voltage $V_{out}$ by a load resistor 36. An inductor 38 serves as an RF choke. An inductor 40 and a capacitor 42 collectively form an output impedance matching network and a capacitor 44 functions as a DC blocking capacitor.

In the thus-constituted power amplifier 10, the detector 23 is positioned at the input end of the power amplifier 10 to detect the level of input RF power. The diode 20 converts an input RF signal to a DC signal. The control amplifier 26 compares a reference voltage $V_{ref}$ applied to an input terminal by the voltage source 27 with the voltage of the DC signal applied to an other input terminal and generates a bias voltage suitable for the transistor 32. The power amplifier 10 requires the additional reference voltage and uses an external device, that is, the non-integratable diode. As a result, integration of the power amplifier 10 on a single chip is impossible. Hence, the power amplifier 10 cannot be scaled down.

FIG. 2 is a circuit diagram of another conventional power amplifier in which RF power level is detected at its output end.

Referring to FIG. 2, a power amplifier 50 includes a first power amplification unit 52, a second power amplification unit 54, a gate voltage controller 56, an input matching circuit 58, an intermediate matching circuit 60, and an output matching circuit 62. The gate voltage controller 56 is positioned at the output end of the power amplifier 50 to detect an RF power level.

The gate voltage controller 56 has an output power detector 64 and a voltage divider 66. The output power detector 64 converts a sampled output signal at the output end of the power amplifier 50 to a DC signal. The voltage divider 66, having a −5.0V power supply and two resistors R3 and R4, adjusts the voltage of the DC signal to a voltage level suitable for an amplifier transistor. Then, the adjusted DC signal is fed to the second power amplification unit 54.

The power amplifier has the shortcoming that output power loss may occur in the detection circuit. For example, in the circuit of FIG. 2, a signal passing through the output matching circuit 62 is partially introduced into the gate voltage controller 56, not serving as load. The resulting increased signal loss is highly likely to reduce the peak power and efficiency of the power amplifier. Similar to the power amplifier illustrated in FIG. 1, the power amplifier 50 requires a diode. Therefore, amplifier size is increased and additional external power is required.

SUMMARY OF THE INVENTION

It is, therefore, an object of the present invention to provide an RF power amplifier adopting a power detector constituted of integratable devices, without an additional external power supply or an external diode.

It is another object of the present invention to provide a power detector using a voltage control circuit for controlling a voltage level by means of a source follower being a complementary device.

It is a further object of the present invention to provide a small-size, low-cost, efficiency-improved power amplifier that can be integrated on a single chip.

The above objects are achieved by an integratable RF power amplifier having a variable bias voltage. In the RF power amplifier, a first bias controller detects the amplitude of an RF signal and outputs a DC signal varying with the detected amplitude based on the non-linearity of a rectification transistor. A second bias controller generates a bias voltage that optimizes amplification efficiency by adjusting the voltage of the DC signal received from the first bias controller through a source follower transistor being a complementary device. An amplifier transistor is activated by a driving voltage, amplifies the input signal according to the bias voltage received from the second bias controller, and outputs the amplified signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described below with reference to the accompanying drawings. In the following description, well-known functions or constructions are not described in detail since they would obscure the invention in unnecessary detail.

Figure 3:
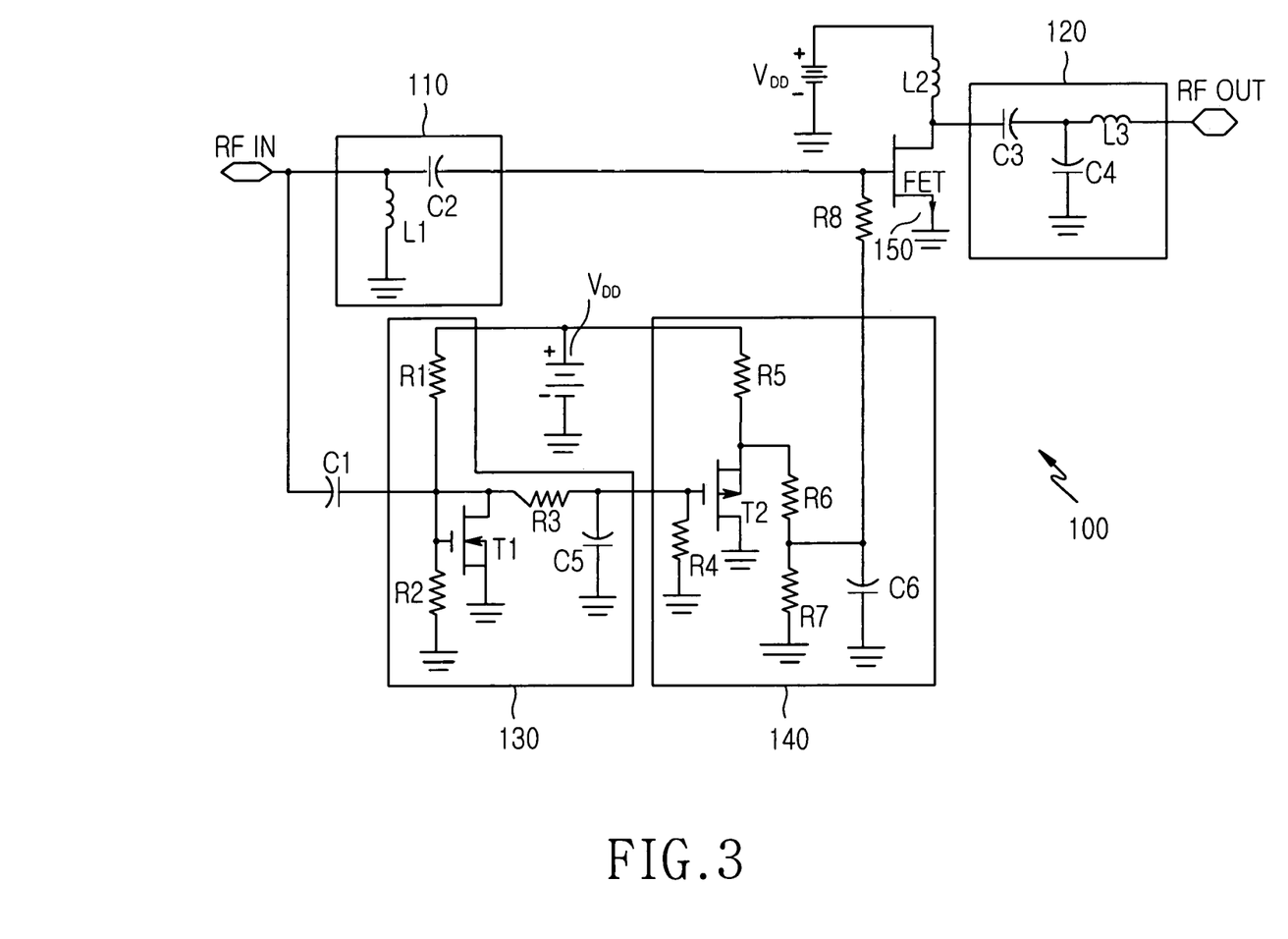
FIG. 3 is a circuit diagram of an integratable power amplifier according to an embodiment of the present invention.

FIG. 3 is a circuit diagram of an integratable power amplifier according to an embodiment of the present invention.

Referring to FIG. 3, a power amplifier 100 includes first and second bias controllers 130 and 140 for controlling a bias voltage according to an input power level in addition to an amplifier transistor 150, preferably an FET (Field Effect Transistor) of type A, AB or B, an input matching circuit 110, and an output matching circuit 120. The input and output matching circuits 110 and 120 are configured with passive devices according to application frequency, gain, and the type of a transistor used.

An RF input signal is fed to the input matching circuit 110, which includes an inductor L1 and a capacitor C2. The inductor L1 and the capacitor C2 can provide an input matching impedance that matches the impedance of the input signal to the input impedance of the amplifier transistor 150. The input signal is also provided to the first bias controller 130 via a capacitor C1. The first bias controller 130 functions as an RF detector for detecting the amplitude of the input signal at the input end of the power amplifier 100 and generating a DC signal that increases or decreases according to the amplitude.

The first bias controller 130 is comprised of bias resistors R1 and R2, a rectification transistor T1, a resistor R3, and a capacitor C5. The bias resistor R1 has an end connected to a driving voltage $V_{DD}$ and the other end connected to the gate of the rectification transistor T1. The bias resistor R2 has an end connected to the gate of the rectifying transistor T1 and the other end grounded. The drain and gate of the rectification transistor T1 are connected to each other and its source is grounded. The resistor R3 has an end connected to the drain of the rectification transistor T1 and the other end connected to an end of the capacitor C5. The other end of the capacitor C5 is grounded. The rectification transistor T1 is an integratable device, which includes an FET.

The second bias controller 140 functions as a DC level shifter for adjusting the voltage of the DC signal to a bias voltage that optimizes amplification efficiency. The second bias controller 140 is preferably comprised of a PMOS (Positive Metal Oxide Semiconductor) FET T2 serving as a source follower, resistors R6 and R7 for dividing a voltage, and a capacitor C6 functioning as a low-pass filter.

The DC signal is fed from the resistor R3 and the capacitor C5 of the first bias controller 130 to the gate of the transistor T2. The gate of the transistor T2 is connected to an end of a resistor R4. The other end of the resistor R4 is grounded. The transistor T2 is activated by receiving the driving voltage $V_{DD}$ at its source from a bias resistor R5 and its drain is grounded. A signal output from the source of the transistor T2 is divided at a predetermined ratio set by the relative resistances of resistors R6 and R7. The divided signal is low-pass-filtered by the capacitor C6 and applied to the gate of the amplifier transistor 150 via a resistor R8 that isolates an RF signal, thereby providing a bias voltage.

The amplifier transistor 150 is activated by the driving voltage $V_{DD}$ and biased via the resistor R8. An inductor L2 connected between the driving voltage $V_{DD}$ and the source of the amplifier transistor 150 functions as an RF choke. The signal amplified by the amplifier transistor 150 is output with an output impedance matched by the output matching circuit 120 including capacitors C3 and C4 and an inductor L3.

To describe the operation of the power amplifier 100 in more detail, an RF signal at an input terminal RF IN is fed to the input matching circuit 110, while its part is sampled and fed to the first bias controller 130 via the capacitor C1. In the first bias controller 130, the input signal is converted to a DC signal that varies with the amplitude of the input signal due to the non-linearity of the rectification transistor T1 biased by the resistors R1 and R2. The DC signal still contains an RF component and much of the RF component is filtered away by the low-pass filter formed by the resistor R3 connected to the rectifying transistor T1 and the capacitor C5.

The filtered DC signal is not suitable as a bias for the amplifier transistor 150 because it has a low voltage of 0V or between 0.2 and 0.3V depending on the power level of the input signal. Therefore, the voltage of the DC signal is shifted up to a predetermined level using the source follower transistor T2 being a complementary device. The shifted amount of the voltage and the bias of the complementary device are adjusted by means of the resistor R5 between the driving voltage $V_{DD}$ and the transistor T2.

The voltage divider formed by the resistors R6 and R7 translates the voltage of the shifted DC signal into a bias voltage suitable for the amplifier transistor 150. The capacitor C6 is grounded between the resistors R6 and R7, thus functioning as a low-pass filter. It removes essentially all of the RF component from the bias signal. The resistor R8 isolates the RF component, transferring the filtered bias signal to the gate of the amplifier transistor 150.

The amplifier transistor 150 is an FET having a gate biased by the bias signal, a grounded source, and a drain that receives the driving voltage $V_{DD}$ via the inductor L2. The amplifier transistor 150 amplifies the input signal received from the input matching circuit 110 and provides the amplified signal to the output matching circuit 120. The output matching circuit 120 is comprised of the capacitor C3 having an end connected to the drain of the amplifier transistor 150, the capacitor C4 having an end connected to the other end of the capacitor C3 and the other end grounded, and the inductor L3 connected between the other end of the capacitor C3 and an output terminal RF OUT of the power amplifier 100. The output matching circuit 120 finally outputs the amplified signal after matching its output impedance.

Figure 4:
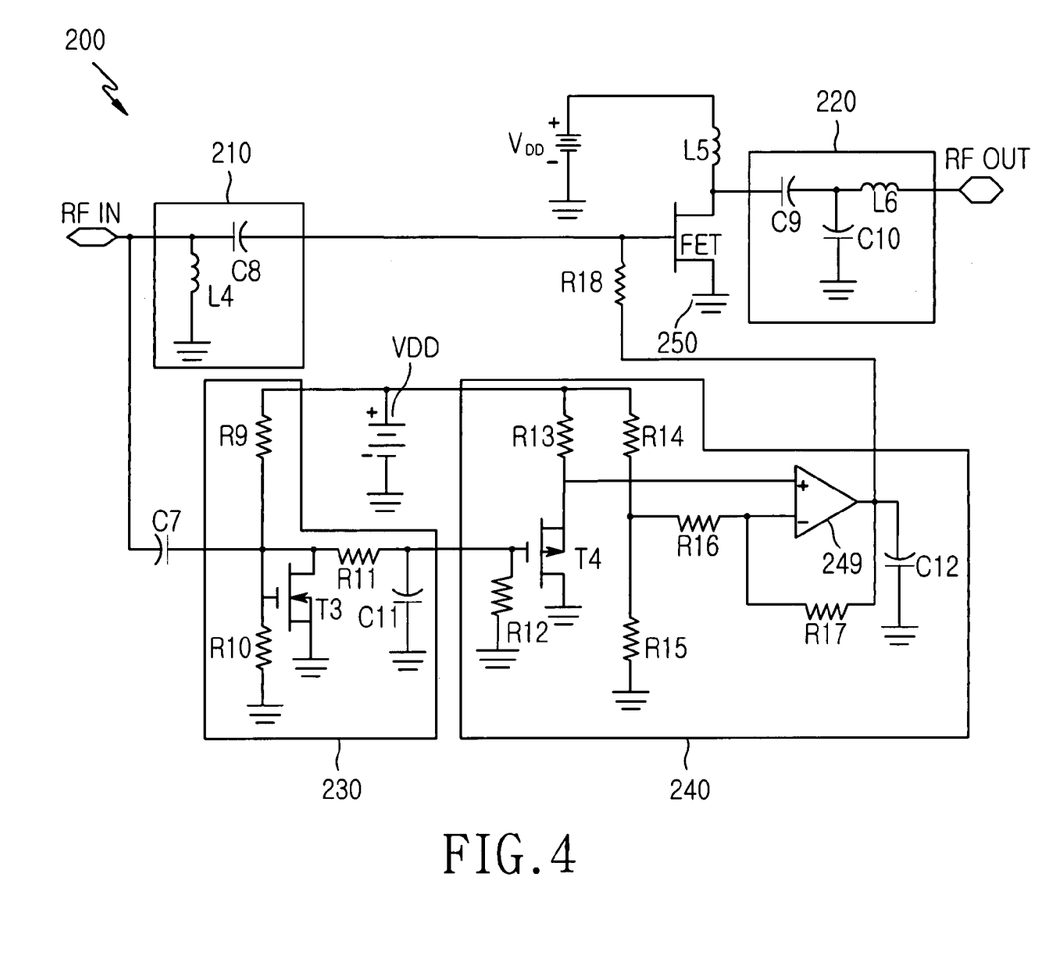
FIG. 4 is a circuit diagram of an integratable power amplifier according to another embodiment of the present invention.

FIG. 4 is a circuit diagram of an integratable power amplifier according to another embodiment of the present invention.

Referring to FIG. 4, a power amplifier 200 includes an amplifier transistor 250, preferably an FET of type A, AB or B, an input matching circuit 210, an output matching circuit 220, and first and second bias controllers 230 and 240. As compared to the power amplifier illustrated in FIG. 3, the second bias controller 240 generates a DC signal using a source follower transistor T4 being a complementary device such as PMOS and converts the voltage of the DC signal to a bias voltage suitable for the amplifier transistor 250 by means of an operation amplifier 249.

An RF input signal is fed to the input matching circuit 210, which includes an inductor L4 and a capacitor C8. The inductor L4 and the capacitor C8 can provide an input matching impedance that matches the impedance of the input signal to the input impedance of the amplifier transistor 250. The input signal is also fed to the first bias controller 230 via a capacitor C7. The first bias controller 230 functions as an RF detector for detecting the amplitude of the input signal at the input end of the power amplifier 200 and generating a DC signal which increases or decreases according to the detected amplitude.

The first bias controller 230 includes bias resistors R9 and R10, a rectification transistor T3, a resistor R11, and a capacitor C11. The bias resistor R9 has an end connected to the driving voltage $V_{DD}$ and the other end connected to the gate of the rectification transistor T3. The bias resistor R10 has an end connected to the gate of the rectification transistor T3 and the other end grounded. The drain and gate of the rectification transistor T3 are connected to each other and its source is grounded. An end of the resistor R11 is connected to the drain of the rectification transistor T3 and the other end thereof is connected to an end of the capacitor C11. The other end of the capacitor C11 is grounded. The rectification transistor T3 is an integratable device, which includes an FET.

The second bias controller 240 functions as a DC level shifter for adjusting the voltage of a DC signal generated in the first bias controller 230 to a bias voltage that optimizes the efficiency of the power amplifier 200. The second bias controller 240 has the source follower transistor T4, preferably a PMOS FET, resistors R14 and R15 for dividing a voltage, the operation amplifier 249, resistors R16 and R17 for dividing a voltage, and a capacitor C12 functioning as a low-pass filter.

The DC signal generated in the first bias controller 230 is fed from the resistor R11 and the capacitor C11 to the gate of the transistor T4. The gate of the transistor T4 is connected to an end of the resistor R12. The other end of the resistor R12 is grounded. The transistor T4 is activated by the driving voltage $V_{DD}$ received at its source from a bias resistor R13, and its drain is grounded. A signal output from the source of the transistor T4 is fed to a positive input terminal of the operation amplifier 249.

The resistors R14 and R15, instead of using an additional external power supply, divide the driving voltage $V_{DD}$ at a predetermined ratio, and provide a divided voltage as a reference voltage to a negative input terminal of the operation amplifier 249 via the resistor R16. An output terminal of the operation amplifier 249 is grounded via the capacitor C12 and the resistor R17 feeds back the output of the operation amplifier 249 to its negative input terminal.

The operation amplifier 249 compares the voltage of the signal received from the transistor T4 with the reference voltage. A DC signal representing the comparison result is divided at a predetermined ratio set by the relative resistances of resistors R16 and R17 and output as a bias control signal. The bias control signal is low-pass filtered by the capacitor C12 and applied to the gate of the amplifier transistor 250 via a resistor R18, thereby producing a bias voltage.

The amplifier transistor 250 is activated by the driving voltage $V_{DD}$ and biased via the resistor R18. An inductor L5 connected between the driving voltage $V_{DD}$ and the source of the amplifier transistor 250 acts as an RF choke. A signal amplified by the amplifier transistor 250 is output with an output impedance matched by the output matching circuit 220 having capacitors C9 and C10 and an inductor L6.

The output matching circuit 220 is comprised of the capacitor C9 having an end connected to the drain of the amplifier transistor 250, the capacitor C10 having an end connected to the other end of the capacitor C9 and the other end grounded, and the inductor L6 connected between the other end of the capacitor C9 and an output terminal RF OUT of the power amplifier 200. The output matching circuit 220 matches the output impedance of the amplified signal.

The power amplifier illustrated in FIG. 4 is so configured that the level and variation range of a bias voltage can be adjusted more precisely by use of the operation amplifier 249. Like the power amplifier illustrated in FIG. 3, the operation amplifier 249 is activated by a driving voltage divided by the resistors R14 and R15, without using additional external power. The output of the operation amplifier 249 is adjusted to have an optimum voltage level according to the resistance ratio of the resistor R16 to the resistor R17.

Figure 5:
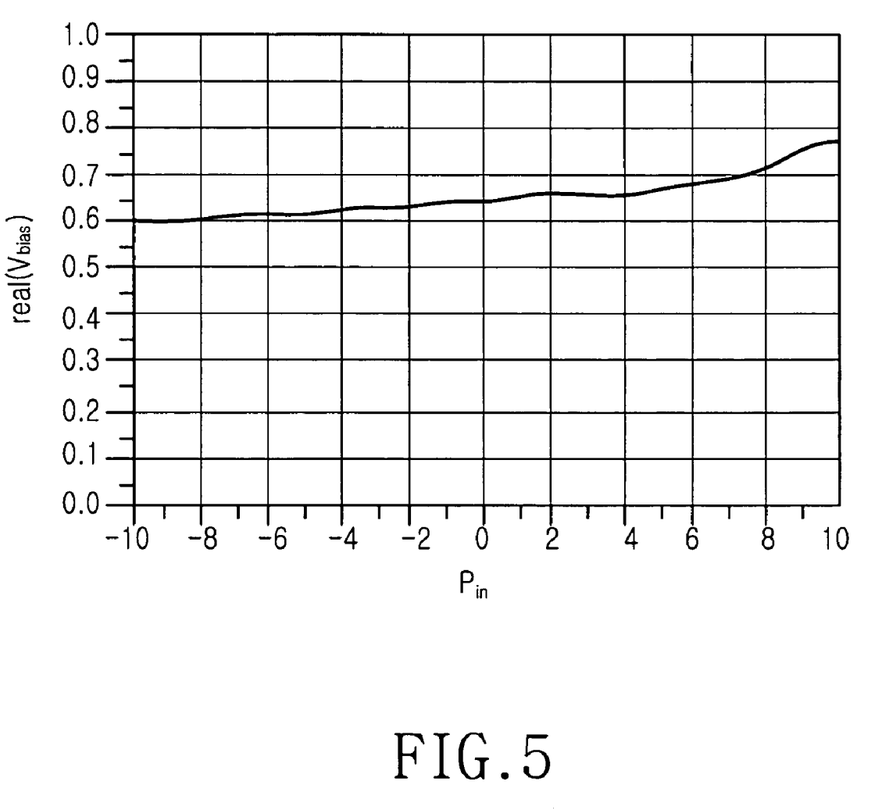
FIG. 5 is a graph illustrating input power versus bias voltage in the power amplifiers according to the present invention.
Figure 7:
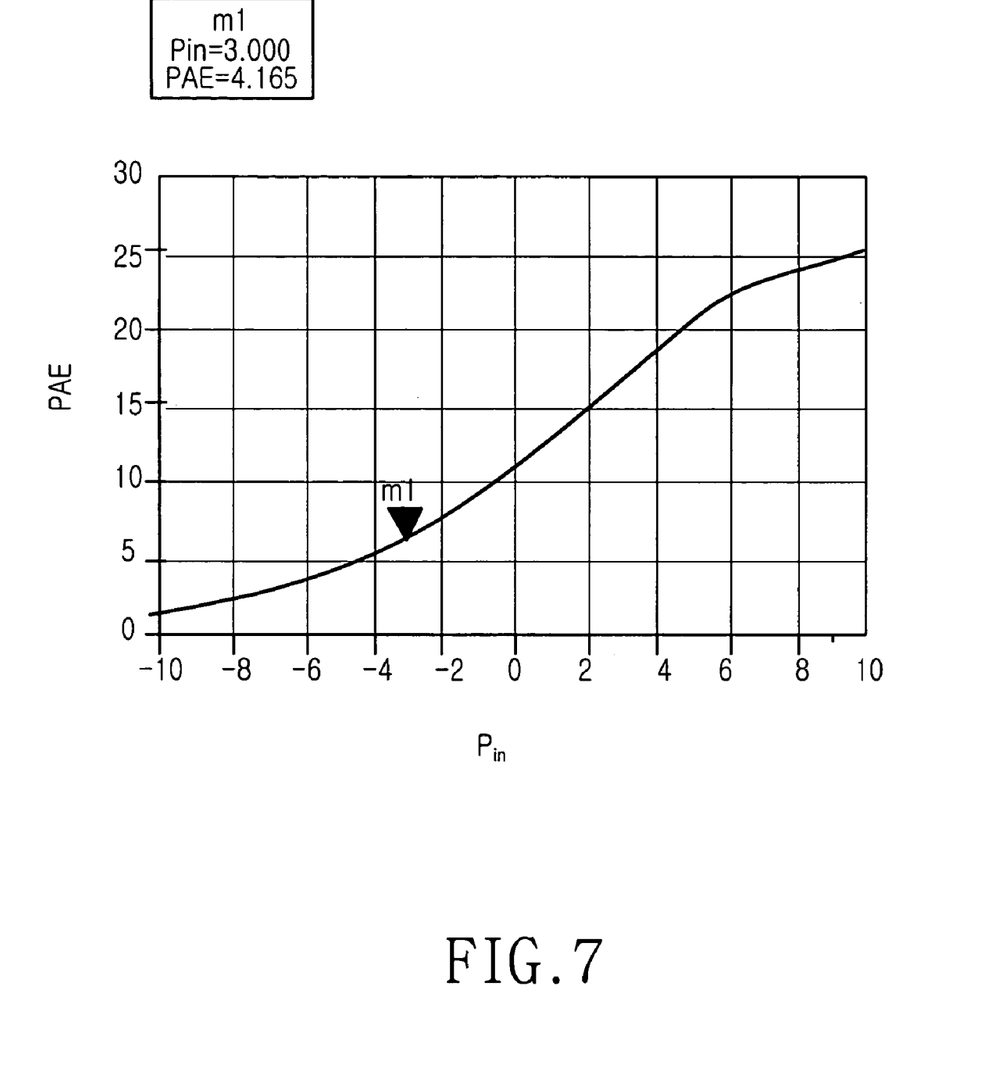
FIG. 7 is a graph illustrating input power versus efficiency in the power amplifiers using variable bias circuits according to the present invention.

FIGS. 5 and 7 are graphs illustrating the performance of a power amplifier according to the present invention.

FIG. 5 illustrates variable bias voltage in the power amplifier. In a power amplifier without a variable bias, a bias voltage applied to the gate of an amplifier transistor is maintained at a predetermined voltage irrespective of an input power level, while in the power amplifier according to the present invention, the bias voltage varies with the input power level.

A bias voltage near a peak power point in the inventive power amplifier is almost identical to that in a typical power amplifier free of a variable bias circuit. However, as the input power decreases gradually, amplification performance can be achieved with a small current without using the large current required in conventional systems for maximum power operation. Therefore, lowering a bias voltage applied to a transistor reduces DC power consumption and improves the Power Added Efficiency (PAE) of the amplifier.

Figure 6:
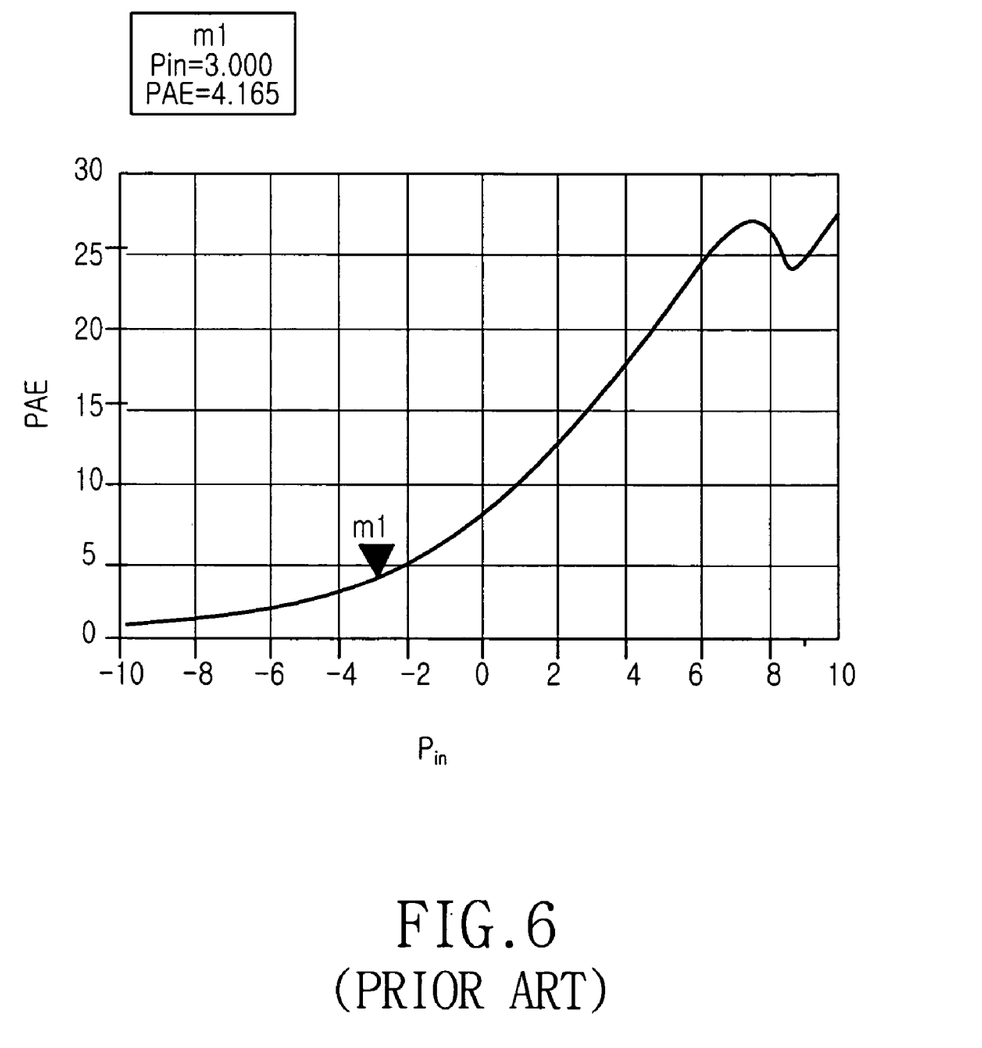
FIG. 6 is a graph illustrating input power versus efficiency in a conventional power amplifier without a variable bias circuit.

FIG. 6 illustrates input power versus efficiency in the typical power amplifier without a variable bias circuit, and FIG. 7 illustrates input power versus efficiency in the power amplifier having a variable bias circuit according to the present invention. As noted, practically the same efficiency is observed at a peak power in both power amplifiers. At a low power of about −3 dBm, however, the efficiency of the power amplifier according to the present invention is 6.5%, an almost 60% increase from the efficiency 4.5% of the conventional power amplifier. That is, the variable bias circuit of the present invention remarkably improves efficiency at low power, maintaining the peak power of the power amplifier and efficiency at the peak power.

As described above, the present invention has the following major effects.

The present invention provides a bias circuit for a power amplifier, which varies a bias voltage applied to an amplifier transistor according to the amplitude of an input signal, thus improving efficiency at statistically widely used low power levels, maintaining amplification efficiency at a peak power. The power amplifier requires no additional bias circuits for generating power since it does not use an external power supply. Due to the use of a power detector with an integratable transistor such as a Metal Oxide Semiconductor Field Effect Transistor (MOSFET) instead of using an external diode, the power amplifier can be simplified and miniaturized. Furthermore, adjustment of a bias voltage suitable for the amplifier transistor by use of a voltage control circuit including a source follower based on a complementary device such as PMOS makes it possible to integrate all circuits on a single chip and thus to fabricate a small-size, low-cost and efficiency-improved power amplifier.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An RF (Radio Frequency) power amplifier comprising:
   a first bias controller for detecting an amplitude of an input RF signal and outputting a DC (Direct Current) signal varying with the detected amplitude based on a non-linearity of a rectification transistor;
   a second bias controller for generating a bias voltage that optimizes amplification efficiency by adjusting the voltage of the DC signal received from the first bias controller through a source follower transistor; and
   an amplifier transistor activated by a driving voltage, for amplifying the input signal according to the bias voltage received from the second bias controller and outputting the amplified signal.

2. The RF power amplifier of claim 1, wherein the first bias controller comprises:
   the rectification transistor having a gate for receiving the input signal, a drain connected to the gate, and a grounded source;
   a first bias resistor having an end connected to the driving voltage of the amplifier transistor and an other end connected to the gate of the rectification transistor;
   a second bias resistor having an end connected to the gate of the rectification transistor and an other end connected to ground; and
   a first low-pass filter connected to the drain of the rectification transistor, for reducing an RF component from the DC signal and providing the RF component-reduced DC signal to the second bias controller.

3. The RF power amplifier of claim 2, wherein the first low-pass filter comprises a resistor having a first end connected to the drain of the rectification transistor and a second end connected to a first end of a capacitor and the capacitor having a second end connected to ground, the second end of the resistor being an output end of the first bias controller.

4. The RF power amplifier of claim 2, wherein the second bias controller comprises:
   a third bias resistor having an end connected to the driving voltage;
   the source follower transistor having a gate connected to an output end of the first bias controller, a grounded drain, and a source connected to an other end of the third bias resistor;
   a divider having a first division resistor having a first end connected to the source of the source follower transistor and a second division resistor having a first end connected to a second end of the first division resistor and having a second end connected to ground, for adjusting the voltage level of the DC signal received from the first bias controller; and
   a second low-pass filter for removing an RF component from a signal received from the divider and providing the RF component-free signal as the bias voltage to the amplifier transistor.

5. The RF power amplifier of claim 4, wherein the source follower transistor is a complementary device.

6. The RF power amplifier of claim 4, wherein the second low-pass filter comprises a capacitor having a first end connected to the second end of the first division resistor and a second end connected to ground, the first end of the capacitor being an output end of the second bias controller.

7. The RF power amplifier of claim 2, wherein the second bias controller comprises:
   a third bias resistor having an end connected to the driving voltage;
   the source follower transistor having a gate connected to an output end of the first bias controller, a grounded drain, and a source connected to an other end of the third bias resistor;
   a first divider including a first division resistor having a first end connected to the driving voltage and a second division resistor having a first end connected to a second end of the first division resistor and having a second end connected to ground;
   a first resistor having a first end connected to the second end of the first division resistor;
   an operational amplifier having a positive input connected to the source of the source follower transistor and a negative input connected to a second end of the first resistor;
   a second resistor for feeding back the output of the operation amplifier to the negative input of the operation amplifier; and
   a second low-pass filter for removing the RF component from the output of the power operation amplifier and providing the RF component-free signal as the bias voltage to the amplifier transistor.

8. The RF power amplifier of claim 7, wherein the source follower transistor is a complementary device.

9. The RF power amplifier of claim 7, wherein the second low-pass filter comprises a capacitor having a first end connected to the output of the operation amplifier and a second end connected to ground, the first end of the capacitor being an output end of the second bias controller.

10. The RF power amplifier of claim 1, further comprising input and output matching circuits for matching the impedances of the input and output signals to the input and output impedances of the amplifier transistor.

11. An RF (Radio Frequency) power amplifier comprising:
a first bias controller for detecting an amplitude of an input RF signal and outputting a DC (Direct Current) signal varying with the detected amplitude based on a non-linearity of a rectification transistor;
a second bias controller for generating a bias voltage that optimizes amplification efficiency by adjusting the voltage of the DC signal received from the first bias controller through a source follower transistor; and
an amplifier transistor activated by a driving voltage, for amplifying the input signal according to the bias voltage received from the second bias controller and outputting the amplified signal, wherein:
the second bias controller includes:
a first bias resistor having an end connected to the driving voltage;
the source follower transistor having a gate connected to an output end of the first bias controller, a grounded drain, and a source connected to an other end of the first bias resistor;
a divider having a first division resistor having a first end connected to the source of the source follower transistor and a second division resistor having a first end connected to a second end of the first division resistor and having a second end connected to ground, for adjusting the voltage level of the DC signal received from the first bias controller; and
a first low-pass filter for removing an RF component from a signal received from the divider and providing the RF component-free signal as the bias voltage to the amplifier transistor.

12. The RF power amplifier of claim 11, wherein the first bias controller comprises:
the rectification transistor having a gate for receiving the input signal, a drain connected to the gate, and a grounded source;
a second bias resistor having an end connected to the driving voltage of the amplifier transistor and an other end connected to the gate of the rectification transistor;
a third bias resistor having an end connected to the gate of the rectification transistor and an other end connected to ground; and
a second low-pass filter connected to the drain of the rectification transistor, for reducing an RF component from the DC signal and providing the RF component-reduced DC signal to the second bias controller.

13. The RF power amplifier of claim 12, wherein the second low-pass filter comprises a resistor having a first end connected to the drain of the rectification transistor and a second end connected to a first end of a capacitor and the capacitor having a second end connected to ground, the second end of the resistor being the output end of the first bias controller.

14. The RF power amplifier of claim 11, wherein the source follower transistor is a complementary device.

15. The RF power amplifier of claim 11, wherein the first low-pass filter comprises a capacitor having a first end connected to the second end of the first division resistor and a second end connected to ground, the first end of the capacitor being an output of the second bias controller.

16. An RF (Radio Frequency) power amplifier comprising:
a first bias controller for detecting an amplitude of an input RF signal and outputting a DC (Direct Current) signal varying with the detected amplitude based on a non-linearity of a rectification transistor;
a second bias controller for generating a bias voltage that optimizes amplification efficiency by adjusting the voltage of the DC signal received from the first bias controller through a source follower transistor; and
an amplifier transistor activated by a driving voltage, for amplifying the input signal according to the bias voltage received from the second bias controller and outputting the amplified signal, wherein
the second bias controller includes:
a first bias resistor having an end connected to the driving voltage;
the source follower transistor having a gate connected to an output terminal of the first bias controller, a grounded drain, and a source connected to an other end of the first bias resistor;
a first divider including a first division resistor having a first end connected to the driving voltage and a second division resistor having a first end connected to a second end of the first division resistor and having a second end connected to ground;
a first resistor having a first end connected to the second end of the first division resistor;
an operational amplifier having a positive input connected to the source of the source follower transistor and a negative input connected to a second end of the first resistor;
a second resistor for feeding back the output of the operation amplifier to the negative input of the operation amplifier; and
a first low-pass filter for removing the RF component from the output of the power operational amplifier and providing the RF component-free signal as the bias voltage to the amplifier transistor.

17. The RF power amplifier of claim 16, wherein the first bias controller comprises:
the rectification transistor having a gate for receiving the input signal, a drain connected to the gate, and a grounded source;
a second bias resistor having an end connected to the driving voltage of the amplifier transistor and an other end connected to the gate of the rectification transistor;
a third bias resistor having an end connected to the gate of the rectification transistor and an other end connected to ground; and
a second low-pass filter connected to the drain of the rectification transistor, for reducing an RF component from the DC signal and providing the RF component-reduced DC signal to the second bias controller.

18. The RF power amplifier of claim 17, wherein the second low-pass filter comprises a resistor having a first end connected to the drain of the rectification transistor and a second end connected to a first end of a capacitor and the capacitor having a second end connected to ground, the second end of the resistor being the output end of the first bias controller.

19. The RF power amplifier of claim 16, wherein the source follower transistor is a complementary device.

20. The RF power amplifier of claim 16, wherein the first low-pass filter comprises a capacitor having a first end connected to an output of the operational amplifier and a second end connected to ground, the first end of the capacitor being an output of the second bias controller.

* * * * *